United States Patent [19]

Briand et al.

[11] Patent Number: 5,049,820
[45] Date of Patent: Sep. 17, 1991

[54] MAGNETIC RESONANCE SIGNAL ACQUISITION METHODS

[75] Inventors: Jacques Briand, Zurich, Switzerland; Laurance D. Hall, Cambridge, England

[73] Assignee: National Research Development Corporation, London, England

[21] Appl. No.: 633,184

[22] Filed: Dec. 28, 1990

Related U.S. Application Data

[63] Continuation of Ser. No. 442,792, Nov. 29, 1989, abandoned.

[30] Foreign Application Priority Data

Nov. 29, 1988 [GB] United Kingdom ............... 8827833

[51] Int. Cl.[5] .......................................... G01R 33/20
[52] U.S. Cl. ............................................... 324/309
[58] Field of Search ............... 324/300, 307, 303, 309, 324/310, 311, 312, 313, 314, 318, 322; 128/653 A

[56] References Cited

U.S. PATENT DOCUMENTS 4,021,729 5/1977 Garroway ........................ 324/309
4,480,228 10/1984 Bottomley .
4,531,094 7/1985 Ordidge .
4,698,592 10/1987 Feinberg .
4,706,025 11/1987 Edelstein .
4,712,066 12/1987 Luyten ............................... 324/309
4,771,242 9/1988 Lampman .
4,777,439 10/1988 Granot .

FOREIGN PATENT DOCUMENTS 2122753 9/1984 United Kingdom .
8706700 11/1987 World Int. Prop. O. .

Primary Examiner—Michael J. Tokar
Attorney, Agent, or Firm—Cushman Darby & Cushman

[57] ABSTRACT

A magnetic resonance signal of a volume of interest within an object is acquired by placing the object in a magnetic field and the application of three successive steps. The first step comprises an rf selective 90° pulse of frequency $f_x$ applied in the presence of an x-gradient magnetic field to select a slice. The magnetization of the slice is then inverted. In the second step an rf slective 90° pulse of frequency $f_y$ is applied in the presence of a y-gradient magnetic field to excite a strip of the slice. in the thired step an rf selective 180° pulse of frequency $f_z$ is applied in the presence of a y-gradient magnetic field to refocus the magnetization of a region of said strip. The resulting free induction signal is derived solely from said region.

6 Claims, 9 Drawing Sheets

MAGNETIC RESONANCE SIGNAL ACQUISITION METHODS

This is a continuation of application Ser. No. 07/442,792, filed on Nov. 29, 1989, which was abandoned upon the filing hereof.

This invention relates to magnetic resonance signal acquisition methods and is concerned with obtaining signals from selected regions of an object. The invention has application in nmr spectroscopy and in nmr imaging.

According to the invention a method of obtaining a nuclear magnetic resonance signal from a region of an object comprises subjecting the object to a static magnetic field and carrying out the following steps:

1) saturating all magnetisation of selected nuclei in the object except in a slice orthogonal to one direction by the application of at least one rf selective pulse in the presence of a first gradient magnetic field having a gradient direction parallel to said one direction;

2) in the presence of a second gradient magnetic field having a gradient extending in a direction generally orthogonal to said one direction, applying an rf selective 90° pulse to tip the magnetisation along a strip defined by the intersection of the aforesaid slice and a slice orthogonal to the gradient direction of said second gradient magnetic field; and 3) in the presence of a third gradient magnetic field having a gradient direction extending generally orthogonally to the gradient directions of both the first and second gradient magnetic fields, applying an rf signal to refocus the spins of said nuclei in a region defined by the intersection of said strip and a slice orthogonal to the gradient direction of said third gradient magnetic field so that the resulting free induction echo signal arises from the said region alone.

In carrying out the invention step 1) may comprise a combination of selective and non-selective rf pulses. Additional gradient magnetic field pulses may be applied. The magnetisation within the selected slice may be left intact or may be inverted by step 1). In step 2) the selective 90° pulse may function to tip in the transverse plane to the longitudinal magnetisation of the selected nuclei in the strip.

The pulse sequences embodying the invention comprise three consecutive steps or modules. Each step includes a slice-selective rf pulse and provides spatial selection in a respective plane perpendicular to one of three orthogonal directions. The cumulative effect gives rise to a coherent NMR signal which originates exclusively from the region at the intersection of the three orthogonal planes.

In order that the invention may be more fully understood reference will now be made to the accompanying drawings in which.

Figure 4:
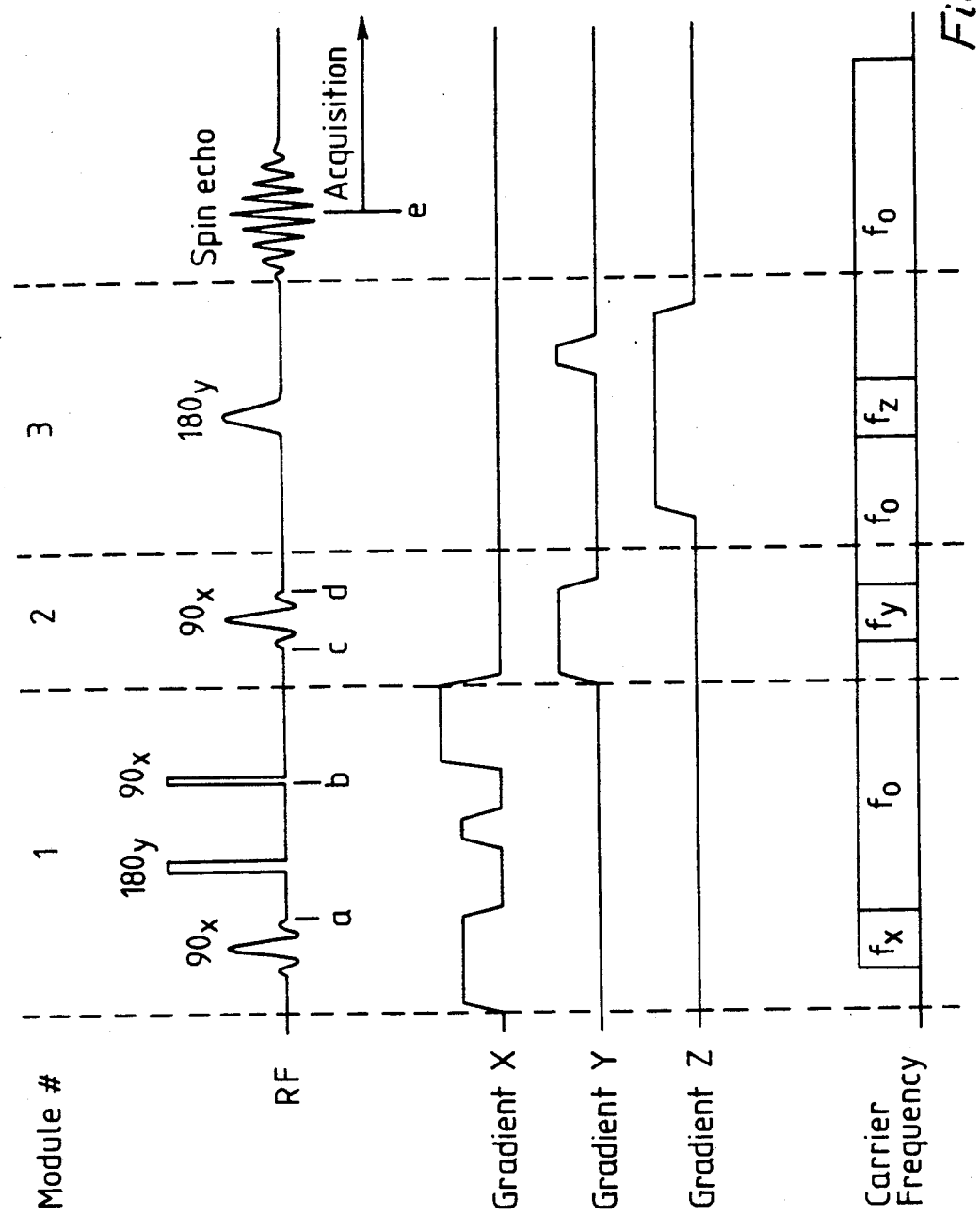
FIG. 4 is another pulse sequence embodying the invention.
Figure 5A:
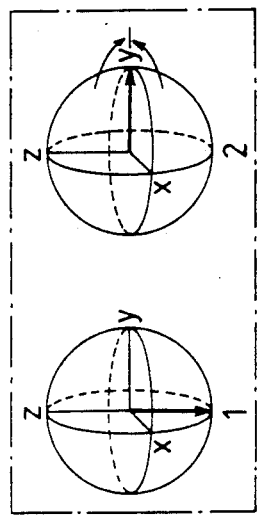
Figure 5B:
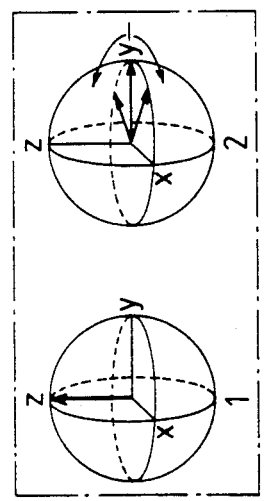
Figure 5C:
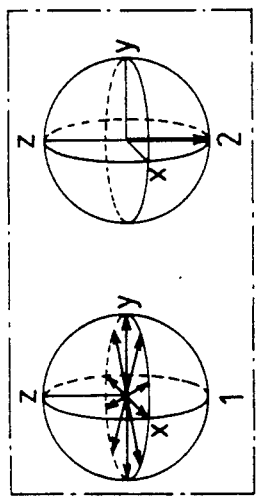
Figure 5D:
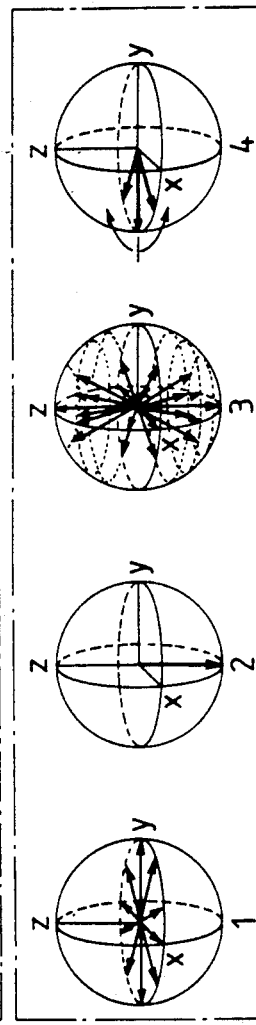
Figure 5E:
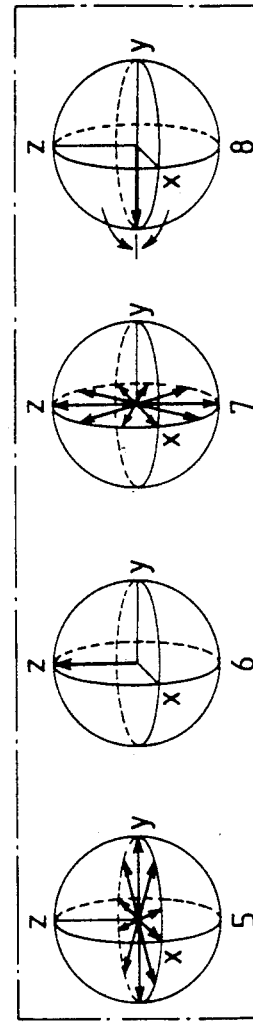
Figure 5:
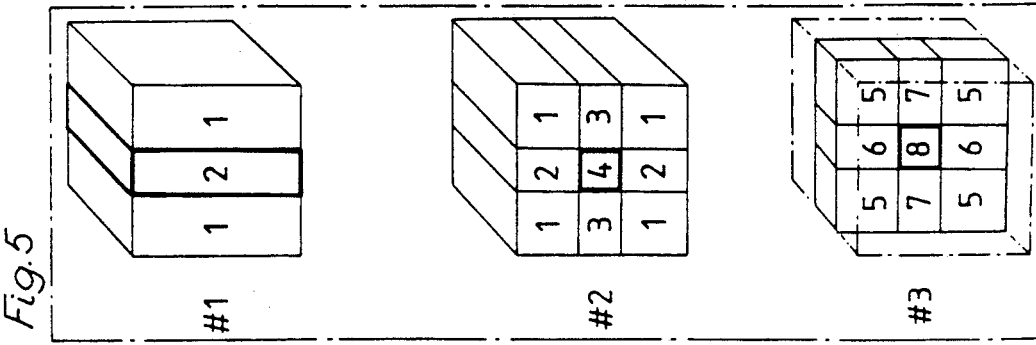

FIG. 5 at (a) to (e) shows visualisations in the rotating frame of the magnetisations of various regions (numbered 1 to 8) of an object at various stages in the pulse sequence of FIG. 4, FIG. 6 shows at A, B and C various partial pulse sequences useful in setting up the complete pulse sequence D, and FIG. 7 illustrates, at A, B, C and D, a cylindrical object and images of successively smaller regions thereof.

Figure 1:
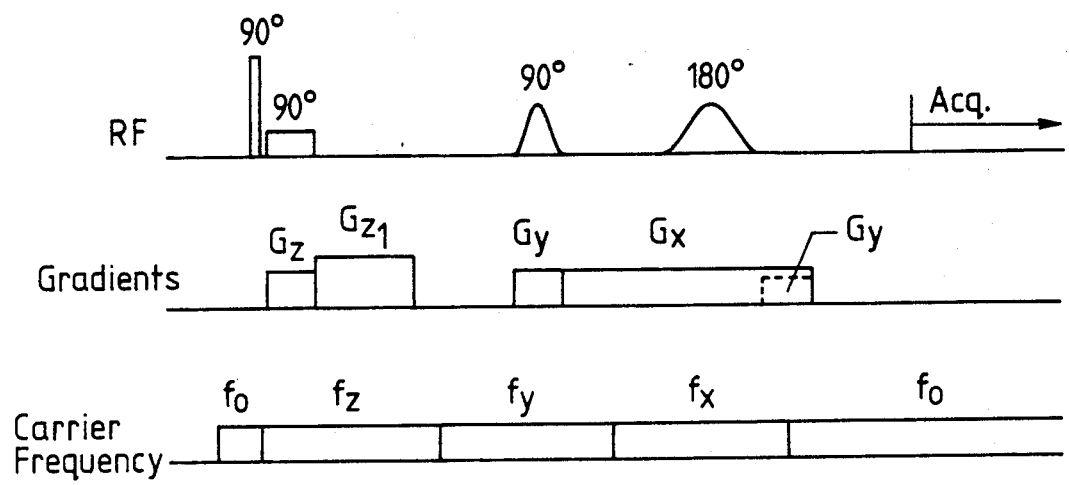
FIG. 1 is pulse sequence embodying the invention.

The first step of the pulse sequence of FIG. 1 comprises a sequence of an rf 90° non-selective pulse which tips the spins of selected nuclei (usually protons) in the entire object into a transverse direction, followed by a 90° selective pulse which is applied in the presence of a gradient magnetic field $G_z$ having a gradient in the z-direction. This tips the spins in a slice in the XY plane back into the longitudinal direction. The position of the slice is determined by the frequency of the selective pulse and the magnitude of the z-gradient field. Immediately thereafter an intense Z gradient magnetic field pulse $G_{z1}$ is applied which dephases incoherently the transverse magnetisation that has been created elsewhere.

Alternative versions of the above-described first step are that after the 90° non-selective rf pulse a z-gradient magnetic field pulse followed by a 180° non-selective rf pulse are applied before the 90° selective rf pulse in the presence of a z-gradient magnetic field. The time sequence of the magnetic field pulse and 180° non-selective pulse may be reversed, in which case the gradient magnetic field pulse is in the opposite direction.

In yet another alternative of the first step a 90° selective rf pulse is applied first and is followed by a sequence of a non-selective 180° pulse, a refocusing z-gradient magnetic field pulse and a 90° non-selective pulse. The z-gradient magnetic field pulse may be applied before the 180° rf pulse, in which case it is in the opposite direction.

The second step consists of the application of a 90° selective pulse in the presence of a gradient magnetic field $G_y$ having a gradient in the y-direction. This flips in the transverse plane the inverted magnetisation in a strip which is at the intersection of the above-defined slice and an orthogonal slice in the XZ plane. At this stage magnetisation outside the strip is dephased with respect to the z and y gradient magnetic fields whereas magnetisation in the strip is only dephased with respect to the y gradient.

The third step consists of the application of a 180° selective rf pulse in the presence of an x gradient magnetic field. This selectively refocuses with respect to the y gradient a region in the strip lying at the intersection of the strip and a slice in the YZ plane. The transverse magnetisation of that region is therefore restored and it is that region which constitutes the selected volume of interest. A y-gradient magnetic field pulse may also be applied to rephase the spins with respect to the y gradient. The applied 90° and 180° selective rf pulses may be profiled to have any suitable form, for example a $\sin^2 x$ or a sinc x form.

In the above described pulse sequence in place of simple 90° and 180° rf pulses any combination of tailored rf pulses and gradient magnetic field pulses can be applied to achieve the same effect.

The free induction signal from the object is then acquired and will be derived solely from the selection region. the position of the selected region can be easily moved to different positions by changing the respective carrier frequencies applied in the three different steps and/or the magnitudes of the gradient fields.

Figure 2A:
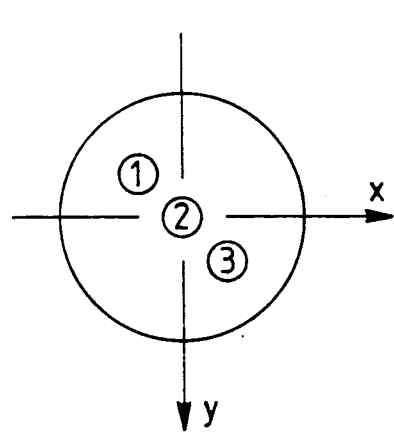
FIGS. 2A and 2B show two orthogonal cross sections of an object comprising three bulbs immersed in a water bath, cross section A being in the Z-plane and cross section B in the X-plane.
Figure 2B:
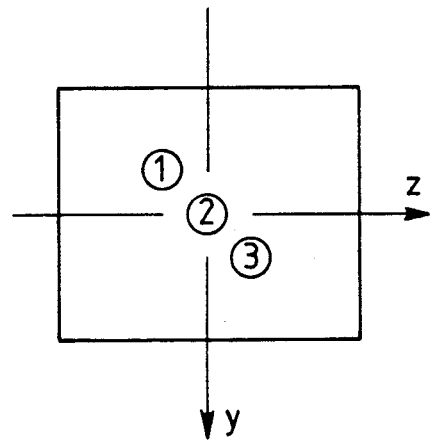

An example of the pulse sequence described with reference to FIG. 1 was applied to a phantom shown in FIG. 2 at A and B which consists of a set of three bulbs labelled 1, 2 and 3 which were immersed in a cylindrical bath filled with water doped with manganese chloride to give a spin-lattice relaxation time $T_1$ of approximately 160 ms. The doped water was only for convenience and similar results can be obtained with pure water. The three bulbs were aligned along an axis making a 45° angle with the three orthogonal axes x, y and z and were filled respectively with cyclohexane, ethanol and benzene.

The results obtained are shown in FIG. 3. FIG. 3A shows the proton spectrum of the whole phantom obtained with a hard 90° pulse only and without the application of the pulse sequence of FIG. 1. The pulse had a width of 67 $\mu$s. It will be seen that the broad spectrum of the water resonance is approximately 400 times larger than the signal originating from each bulb.

Figure 3D:
FIGS. 3B–3D show a series of spectra of different regions of interest of the object coinciding with each of the three bulbs.
Figure 3C:
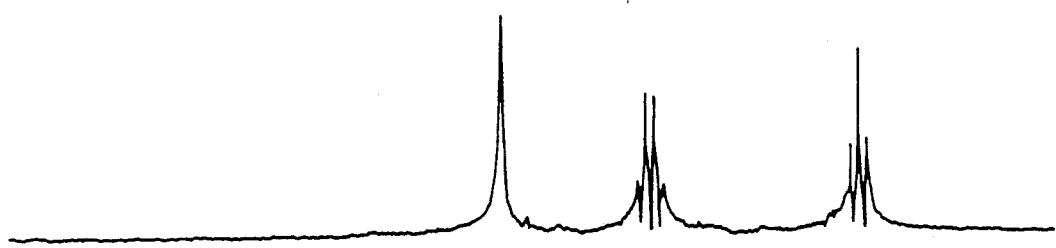
Figure 3B:
Figure 3A:
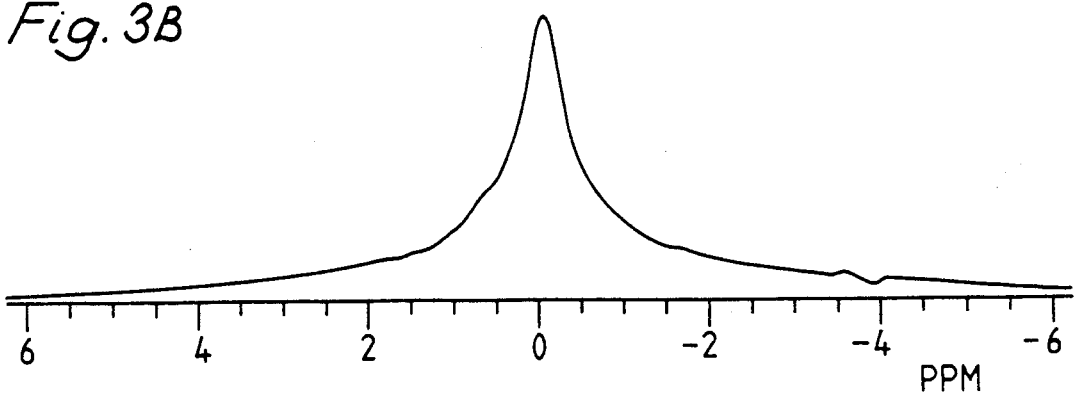
FIG. 3A shows a portion spectrum of the object obtained with a hard 90° rf pulse.

FIGS. 3B to D respectively show the spatial discrimination obtained by selecting the position of each respective bulb 1, 2 and 3 as the selected region of interest. They were processed under identical conditions and are plotted with the same scaling factor. The spectra shown in FIG. 3B of the cyclohexane of bulb 1 and of benzene shown in FIG. 3D are somewhat broader than the spectrum of ethanol obtained in FIG. 3C.

The advantages obtained by the above method is that it is possible to obtain high resolution NMR signals from a selected region using a single acquisition. Furthermore, the amount of rf excitation imposed upon the localised region minimises the loss in resolution and in signal intensity that could have otherwise resulted from the cumulative effects of magnetic field inhomogeneities, improper selective pulses of both 90° and 180°. Likewise the method allows easy adjustment of the location and size of the region of interest without necessitating returning the magnet system.

The above method can be readily extended to enable an image of the selected region to be obtained. To this end additional steps may be interposed between the steps described with reference to FIG. 1. A phase-encoding gradient magnetic field may be applied between the second and third steps and the free induction signal may be acquired in the presence of a gradient magnetic field having a gradient direction orthogonal to the phase-encoding gradient.

A wide range of NMR information can be obtained from the region of interest by a combination of known NMR pulse sequences with the method described herein. Thus to obtain $T_1$ (spin-lattice relaxation time) measurement an initial 180° non-selective rf pulse can be applied followed, after a suitable time delay, by the sequence of FIG. 1. For $T_2$ (spin-spin relaxation time) measurements the FIG. 1 sequence can be preceded by the known Carr-Purcell-Meiboom-Gill pulse sequence. For diffusion measurements an initial sequence of 90°-$\tau$-180°-$\tau$ is applied (where $\tau$ is a delay time), with gradient magnetic field pulses being applied in the $\tau$ intervals.

FIG. 4 is a schematic diagram of an alternative pulse sequence. A convenient and useful way of understanding the localising properties of this sequence is to visualise in the "rotating frame", the evolution of the magnetisation from different portions of the object, at intermediate stages throughout time of the pulse sequence. These visualisations are shown in FIGS. 5(a) to (e) with respect to various regions of the object numbered 1 to 8, at various times.

The initial slice-selective $(90°)_x$ excitation pulse applied in the presence of an x-gradient magnetic field flips in the transverse plane the longitudinal magnetisation from a selected slice perpendicular to a first orthogonal direction, as shown in FIG. 5(a). This transverse magnetisation whose components are partially dephased by the slice-selective pulse is then refocused by a non-selective $(180°)_y$ followed by an x-gradient magnetic field gradient pulse of a time duration necessary to rephase the transverse magnetisation components, as shown in FIG. 5(b). At this point, a non-selective $(90°)_x$ rf pulse is applied, which flips from the transverse plane to the longitudinal axis, along the -z direction, the refocused magnetisation from the slice previously defined. The effect of this pulse is also to rotate in the transverse plane, the longitudinal magnetisation from outside the slice. A strong x-gradient magnetic field pulse is then applied to destroy that transverse magnetisation.

The total effect of the first module, which is named the inversion module, is thus to preserve and invert the longitudinal magnetisation of the selected slice (Region 2) and to dephase incoherently the transverse magnetisation created elsewhere (Region 1), as illustrated in FIG. 5(c).

The second module consists of only a slice-selective $(90°)_x$ excitation pulse applied in the presence of a y-gradient magnetic field pulse which selects a slice perpendicular to the second orthogonal direction. This module has been named the excitation module since its action is to flip in the transverse plane, the longitudinal magnetisation which is at the intersection of the two orthogonal slices defined so far. Upon application of the second module, four different regions with a specific magnetisation state can be distinguished. These regions are depicted in FIG. 5(d). Region 1 is not affected by the slice-selective pulse of the second mudule. However, it is further dephased incoherently by the second orthogonal field gradient pulse applied during the slice-selective pulse. Region 2 is the remaining portion of the slice that was discriminated by the first module, but since it is not affected by the second module, its magnetisation state remains the same. Region 3 corresponds to the portion of the sample that was incoherently dephased by the first module and which is now also affected by the second module. The effect of the second module on the magnetisation of this region is to rotate the previously dephased spins in the xy plane into the xz plane. Furthermore, each magnetisation component is also dephased into sub-components about the z-axis. Finally, Region 4 corresponds to the two intersecting slices. However, the slice-selective pulse of the second module has partially dephased the magnetisation with respect to the second or y-direction orthogonal field gradient.

If a segment of Region 4 is now selectively refocused with respect to the second orthogonal field gradient by applying a frequency-selective 180° pulse in the presence of a third or z-direction orthogonal field gradient followed by a y-direction field gradient pulse of appropriate time duration, the transverse magnetisation from that segment can be restored; this segment constitutes the selected volume of interest. This selective refocusing module, which we have named the refocusing module, constitutes the third module of the sequence. It thus selects a slice orthogonal to the two previously defined slices, and refocuses that magnetisation which is at the intersection of the three orthogonal slices. The magnetisation states from the different portions of the slice that were affected by the third module are depicted in FIG. 5(e). Region 5 corresponds to the portion of Region 1 in (d) that is partially refocused with respect to the second orthogonal field gradient. However, since it was also previously dephased with respect to the first orthogonal field gradient, the transverse magnetisation remains incoherently dephased and thus, it does not induce any coherent signal during the detection period. The magnetisation of Region 6, which corresponds to a portion of Region 2 in FIG. 5(d), remains along the longitudinal axis since the effect of the third module is simply to reinvert the longitudinal magnetisation. Consequently, since it does not have any coherent transverse magnetisation components, it does not produce any detectable signal. Region 7 corresponds to a portion of Region 3 in FIG. 5(d) whereby the action of the third module is to refocus the magnetisation sub-components into the xz plane with respect to the second orthogonal field gradient. Since all the magnetisation components are phased out in the xz plane, there is no net transverse magnetisation and if no refocusing mechanisms occur during the detection period, it will not produce any signal. Finally, Region 8 corresponds to the volume of interest (VOL), and since the transverse magnetisation is refocused with respect to the second orthogonal field gradient, it gives rise to a detectable signal. The entire sequence of the three modules, comprising the inversion module, the excitation module and the refocusing module, may be termed VOISINER.

There are several experimental parameters in the voisiner sequence which must be adjusted to focus on the volume of interest and optimise its performance. A convenient way to describe those parameters is to divide them into two general categories: those which are concerned with the position, size and shape of the volume of interest; and those which are involved with the optimisation of the assigned task that each module must accomplish.

The first group includes the pulse length and carrier frequency of the slice-selective pulses, and the field gradient strengths employed during the slice-selective pulses. They are illustrated in FIGS. 6 A–C and are listed as follows:

$P_1$ Pulse length of the 90° slice-selective pulse used in the first module of VOISINER.

$P_2$ Pulse length of the 90° slice-selective pulse used in the second module of VOISINER.

$P_3$ Pulse length of the 180° slice-selective pulse used in the third module of VOISINER.

$f_x$ RF frequency of the slice-selective pulse which is applied in the presence of the x field gradient.

$f_y$ RF frequency of the slice-selective pulse which is applied in the presence of the y field gradient.

$f_z$ RF frequency of the slice-selective pulse which is applied in the presence of the z field gradient.

$G_{sx}$ X field gradient strength employed during the slice-selective pulse of the first module.

$G_{sy}$ Y field gradient strength employed during the slice-selective pulse of the second module.

$G_{sz}$ Z field gradient strength employed during the slice-selective pulse of the third module.

The location of the VOL, with coordinates (x,y,z), can be focused on by determining the carrier frequencies (fx,fy,fz) of the slice-selective pulses with the following equations:

$$f_x = (\omega_0 + \gamma G_{sx} x)/2\pi$$

$$f_y = (\omega_0 + \gamma G_{sy} y)/2\pi$$

$$f_z = (\omega_0 + \gamma G_{sz} z)/2\pi$$

The volume of interest whose dimensions ($\Delta x, \Delta y, \Delta z$) corresponds to the slice thickness of the three orthogonal slice-selective pulses can be adjusted to the desired size by varying the pulse length of the slice-selective pulse and the field gradient strength applied during slice-selection according to the following relations:

$$\Delta x \propto 1/P_1 G_{sx}, \quad \Delta y \propto 1/P_2 G_{sy}, \quad \Delta z \propto 1/P_3 G_{sz}$$

These relations indicate only the dependence of the slice thickness with respect to the pulse length and the field gradient strength. However, a precise determination of the thickness requires a careful analysis of the waveform employed to modulate the amplitude of the slice-selective pulse. An interesting point to mention here is that the sensitive volume is in most cases, cubic in shape. However, the most general shape of the sensitive volume is a parallel piped; the three slices do not need to be perpendicular to each other, as long as there exists a region where they all intersect.

The second group includes the various time intervals and time delays employed for refocusing and dephasing purposes at different stages of the VOISINER sequence. They also include field gradient rise and fall time delays, introduced to avoid orthogonal field gradient overlap during slice-selective irradiation, and for magnetic field stabilisation before data acquisition. They are illustrated in FIGS. 6 A–D and are listed as follows:

$TE_1$ Time interval corresponding to the time that has elapsed from the middle of the slice-selective pulse of the first module to the top of the echo that occurs just before the application of the non-selective 90° pulse.

$TE_2$ Time interval corresponding to the time that has elapsed from the middle of the slice-selective pulse of the second module to the top of the echo formed upon application of the slice-selective refocusing module.

$T_r$ Time interval following the application of the non-selective 90° pulse of the first module but prior to the application of the slice-selective pulse of the second module. During that time interval, a strong field gradient pulse may be applied to dephase incoherently the transverse magnetisation and furthermore, the magnetisation may partially recover to thermal equilibrium through $T_1$ relaxation.

$D_1$ Time interval corresponding to the time duration of the field gradient pulse necessary to refocus the transverse magnetisation components that were dephased by the slice-selective pulse of the first module.

$D_2$ Time interval corresponding to the time duration of the field gradient pulse necessary to refocus the transverse magnetisation components that were dephased by the slice-selective pulse of the second module.

$D_3$ Time interval preceding the selective refocusing pulse of the third module and during which the spins will dephase with respect to the field gradient applied during the slice-selective refocusing pulse.

This dephasing destroys transverse magnetisation that may or may not be refocused by the slice-selective refocusing pulse. It ensures that transverse magnetisation that is not affected by the refocusing pulse will not persist through the selective pulse and produce an undesirable signal during data acquisition.

$D_4$ Time interval following the slice-selective refocusing pulse which corresponds to the time duration of the field gradient pulse necessary to refocus the transverse magnetisation that was dephased during the time interval $D_3$.

$D_r$ Time delay that allows the field gradient to rise and stabilise to a certain value.

$D_f$ Time delay that allows the field gradient to fall and stabilise to a null value.

$D_s$ Time delay between the VOISINER sequence and data acquisition. This delay can reduce signal distortions caused by eddy currents in the cryostar which are induced by the pulsed field gradients.

The task of adjusting the parameters described above requires careful attention for optimising the performance of VOISINER. In practice, complete adjustment is time consuming because of the number of variables. To adjust simultaneously all the parameters of VOISINER, an efficient and systematic approach is desirable.

One effective approach is to start with just few parameters and gradually incorporate others until the full implementation of the VOISINER sequence. Therefore, before using the complete sequence, it is desirable to implement intermediate stages in which each module is adjusted independently from the other modules. The experimental protocol that we suggest is illustrated in FIGS. 6 A–C. The pulse sequence of FIG. 6A incorporates the refocusing module of VOISINER. This sequence can be seen as a two-dimensional slice-imaging technique, where the slice is selected by the refocusing pulse. The parameters that can be adjusted are $P_3, TE_2, D_3, D_4, f_z$ and $G_{sx}$. Once these parameters are adjusted, the second stage is to incorporate the second module of VOISINER into the sequence replacing the initial non-selective 90° pulse with the slice-selective 90° pulse of the second module; this gives rise to the pulse sequence illustrated in FIG. 6B; now the following parameters can be adjusted: $P_2, D_2, f_y$ and $G_{sy}$. Finally, the third stage consists of incorporating the first module of VOISINER into the sequence of FIG. 6B; this results in FIG. 6C which is the complete VOISINER sequence; the following set of parameters can now be adjusted: $P_1, TE_1, D_1, f_x, T_1$ and $G_{sx}$.

The reason to include some phase-encoding and frequency-encoding field gradients within the pulse sequences of the protocol is that the spatial localisation process at intermediate stages can be directly imaged. It is thus easier to control the efficiency of the localisation process and, in practice, more convenient for optimising the signal intensity of the echo during the final adjustments of the $D_4, D_2$ and $D_1$ refocusing time delays.

Figure 7A:
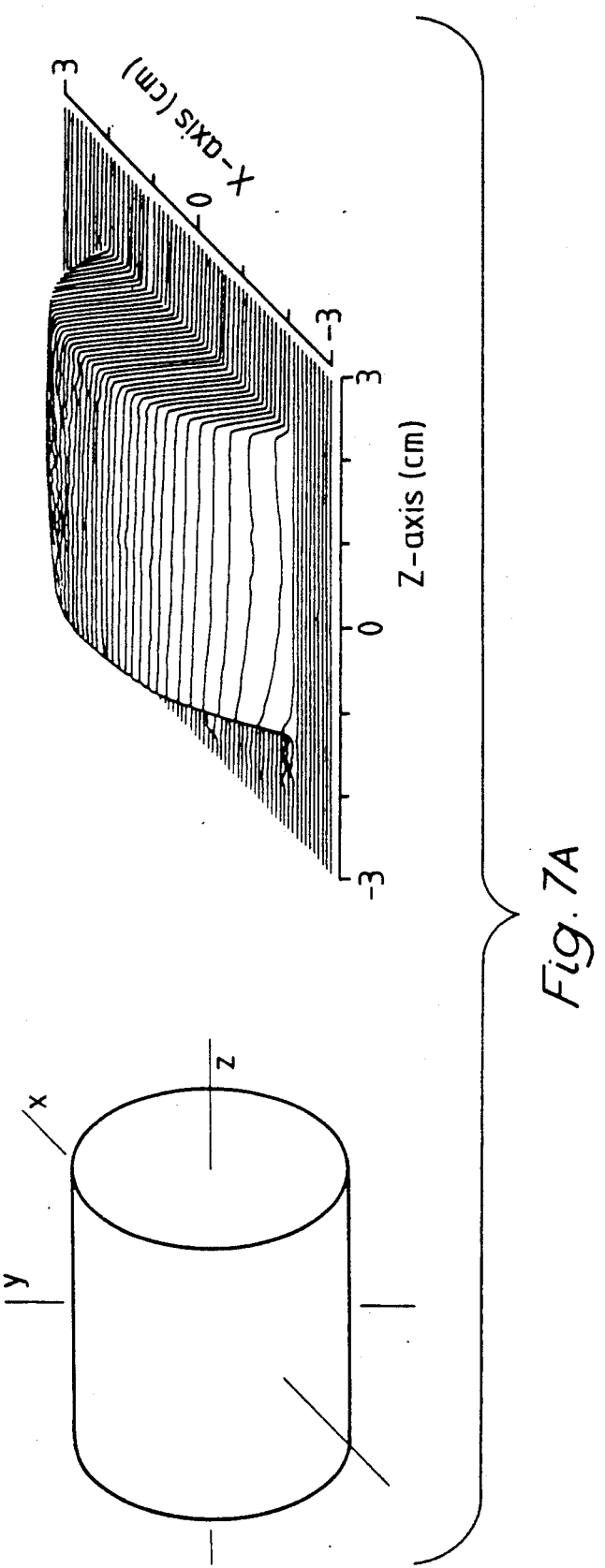
Figure 7B:
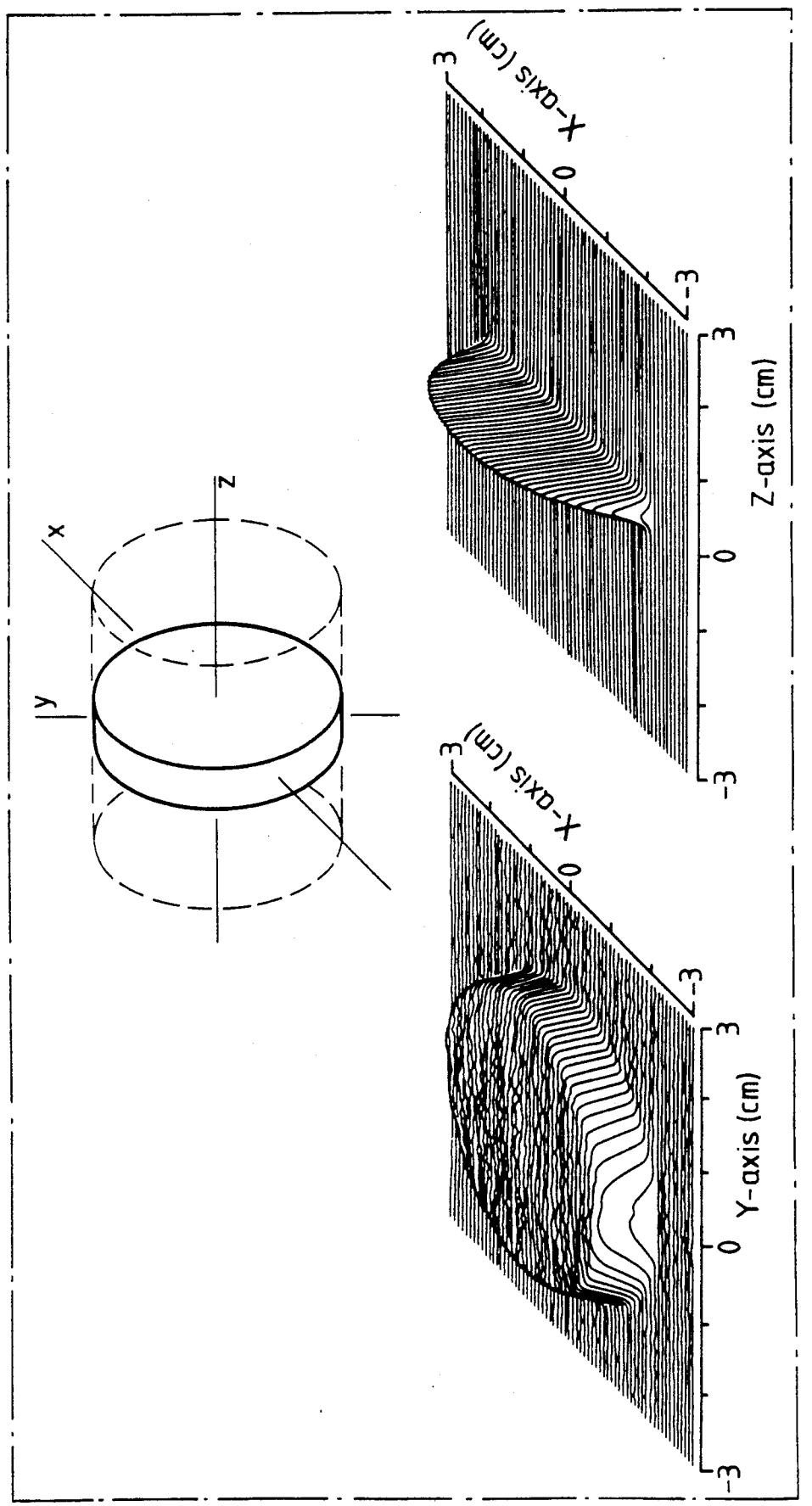
Figure 7C:
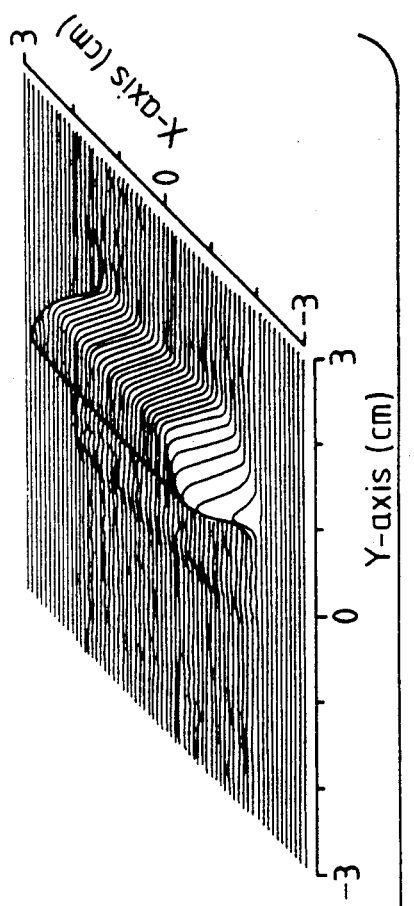
Figure 7C:
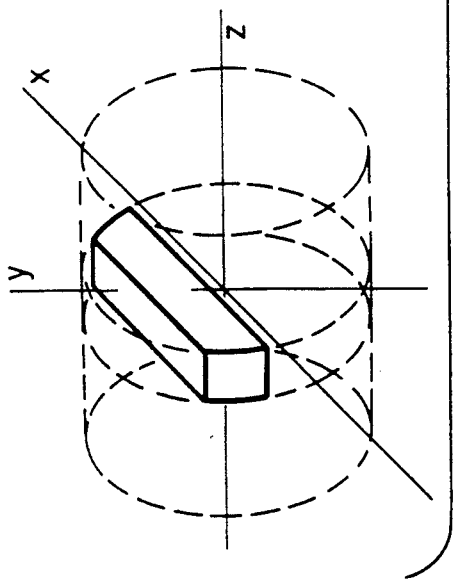
Figure 7D:
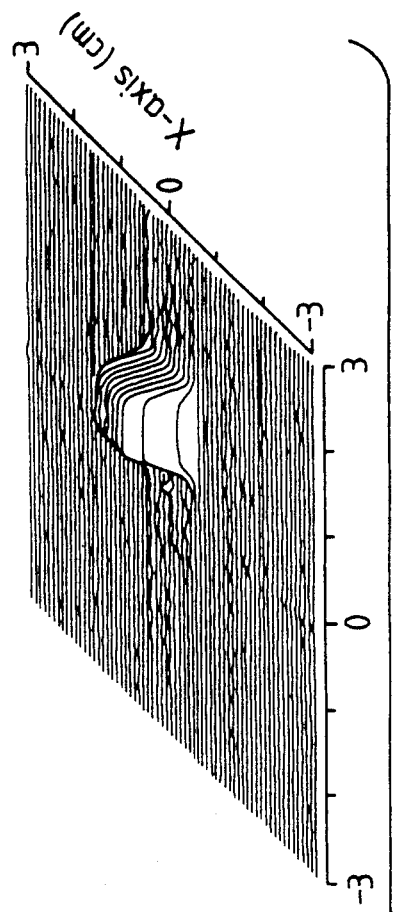
Figure 7D:
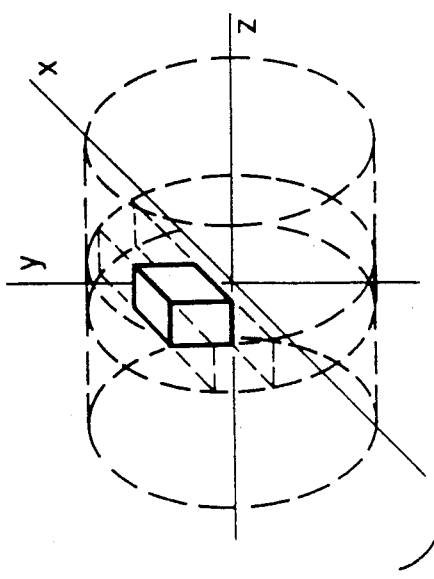

To visualise that protocol, it is instructive to consider an experiment in which there is localisation to a region within a larger object. The model system is illustrated in FIG. 7 and consists of a cylindrical bath (internal diameter, 4 cm; length, 4 cm) filled with water. A two-dimensional image of that system is illustrated in FIG. 7A.

Figure 6A:
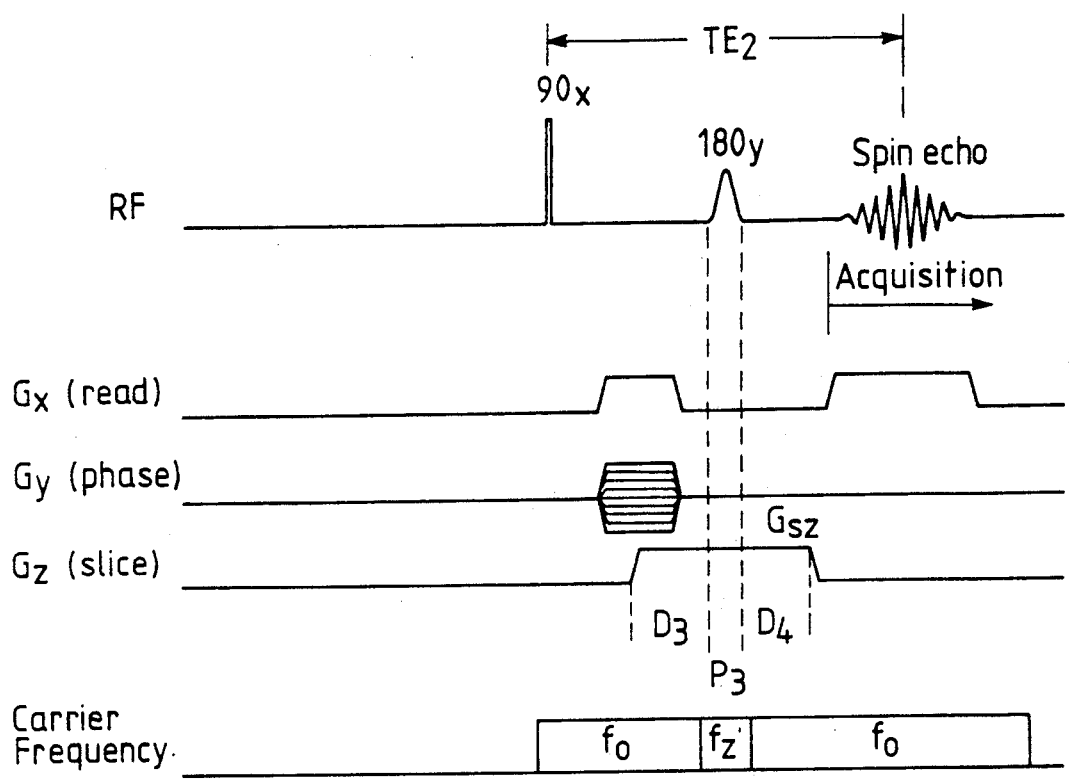
Figure 6B:
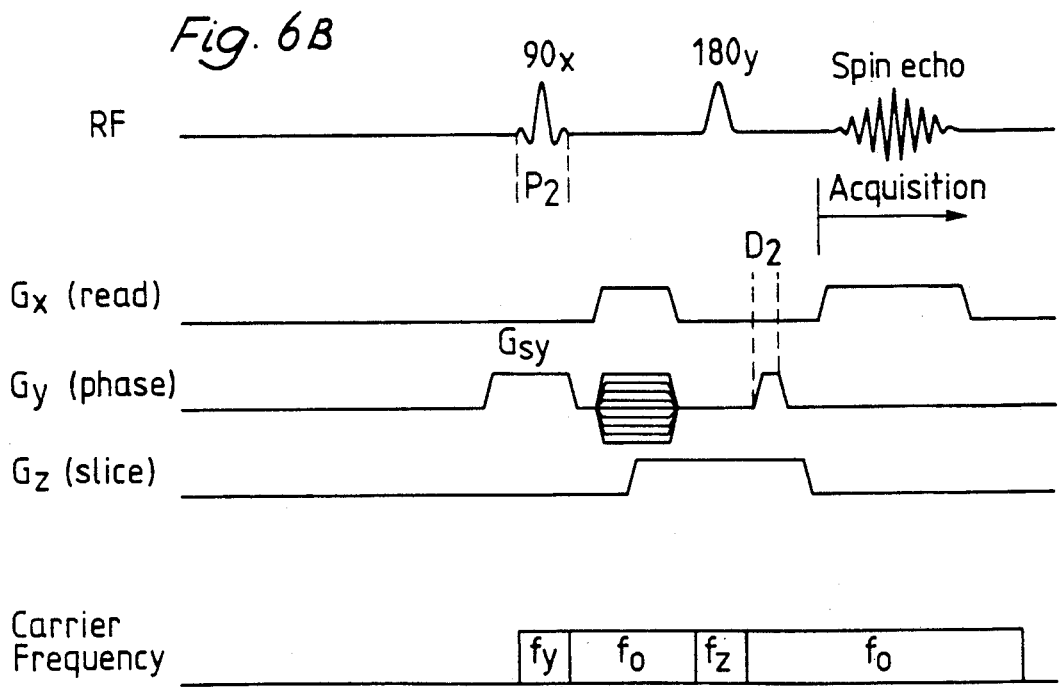
Figure 6C:
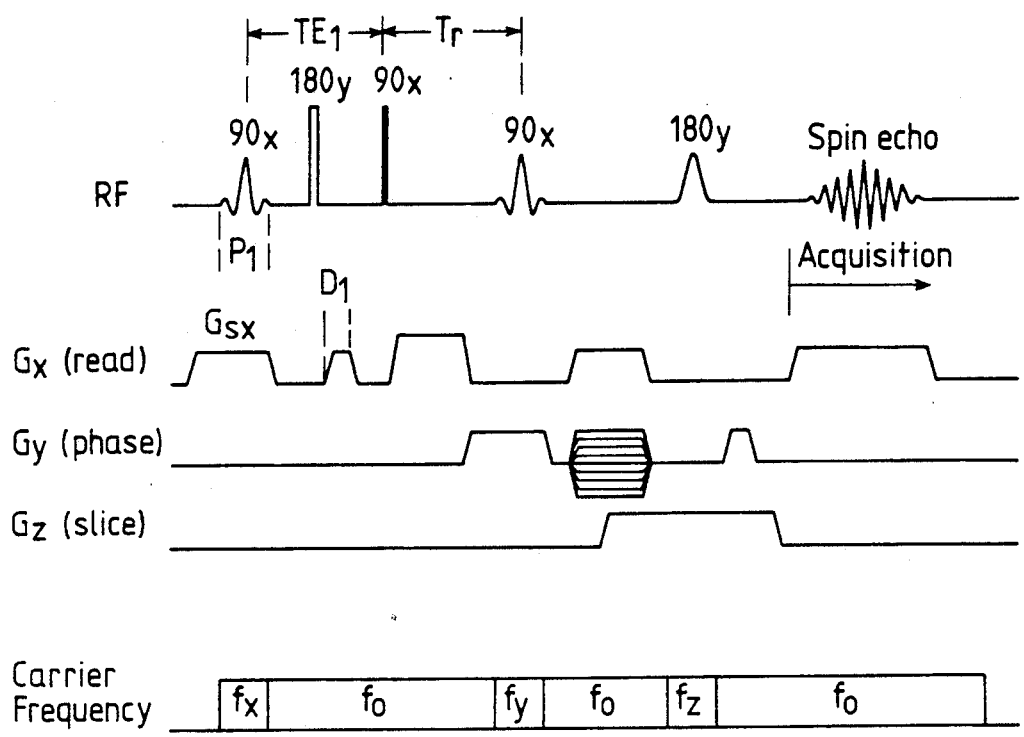
Figure 6D:
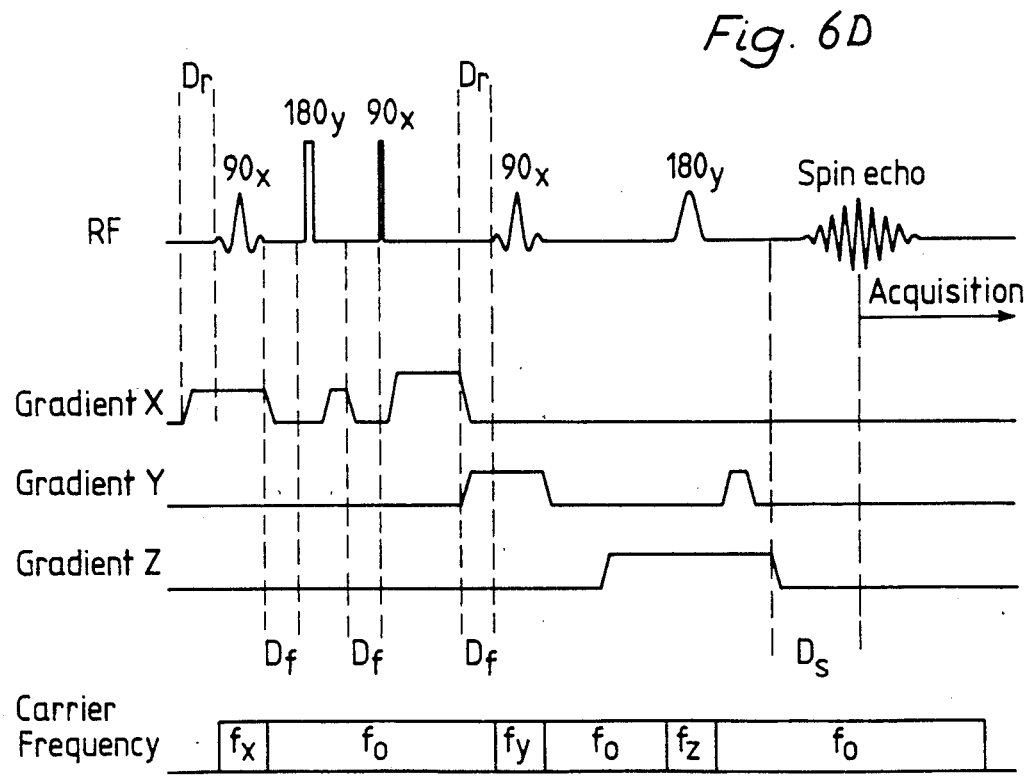

The action of the slice-selective refocusing pulse of FIG. 6A is illustrated in FIG. 7; the first image was obtained by using the z field gradient as the phase encoding gradient and serves to illustrate the efficiency of the slice-selection obtained with a selective refocusing pulse, the slice thickness, and its location along the z axis that was adjusted by the $f_z$ carrier frequency. The same slice is shown in the second image in FIG. 7B but this time, the phase encoding gradient is the y field gradient, as prescribed by the pulse sequence of FIG. 6A. In practice, the $D_3$ and $D_4$ time delays, as prescribed in FIG. 6A, are not equal and that discrepancy increases with longer rise and fall times of the field gradient. This is easily explained by considering that the dephasing angle is proportional to the "area under the curve" and thus, the area under the rise and fall time portions of those delays must be taken into account. The second intermediate stage is illustrated in FIG. 7C and was obtained by the pulse sequence of FIG. 6B; the image obtained now illustrates the efficiency of the slice selection, the slice thickness and its location along the y axis. Finally, in the third stage, the first module is adjusted and FIG. 7D illustrates its action along the x axis; this image was obtained by using the imaging version of the VOISINER sequence (FIG. 6C). When all the parameters are adjusted, the next step, if high-resolution NMR measurements are needed, is to remove the phase- and frequency-encoding gradients and use the high-resolution version of VOISINER that is illustrated in FIG. 4 or FIG. 6D. The use of the $D_r, D_f$ and $D_s$ time delays is prescribed in FIG. D; they should be assigned conservative values in a first instance to ensure that they will not cause any slice-selection and field homogeneity distortions.

The development of the VOISINER method described above for achieving spatially localised NMR was guided primarily by three design objectives: (1) the location of the volume of interest, its size and to a certain extent, its shape, should be easily varied without necessitating retuning the magnet system; (2) the method should basically be able to provide a spatially localised signal in a single acquisition, thus avoiding dynamic range problems caused by any need to differentiate strong unwanted signals, and also to reduce the time it takes to optimise the magnetic field homogeneity for the volume of interest; (3) the number of RF pulses in the sequence should be minimised in order to reduce the amount of RF power deposition and the loss in resolution and signal intensity that could result from the cumulative effects of imperfections arising from the RF pulses.

The VOISINER field gradient and radio frequency pulse sequence (volume of interest by selective inversion, excitation, and refocusing), relies upon the use of frequency-selective pulses in the presence of pulsed field gradients. Such an approach has the significant advantage of enabling a gradient-controlled localisation in all three dimensions by simply varying the carrier frequencies of the slice-selective pulses.

We claim:

1. A method of obtaining a nuclear magnetic resonance signal from a region of an object comprising subjecting the object to a static magnetic field and carrying out the following steps:
   1) applying an rf selective 90° pulse in the presence of a first gradient magnetic field and applying at least one non-selective rf pulse in the absence of a gradient magnetic field so as to dephase incoherently all magnetisation in the object except in a slice orthogonal to the gradient direction of the said first gradient magnetic field;

2) in the presence of a second gradient magnetic field having a gradient extending in a direction generally orthogonal to said one direction and the said static magnetic field, applying an rf selective 90° pulse to tip into a plane perpendicular to the direction of the said static magnetic field a strip defined by the intersection of the aforesaid slice and slice orthogonal to the gradient direction of said second gradient magnetic field; and 3) in the presence of a third gradient magnetic field having a gradient direction extending generally orthogonally to the gradient directions of both the first and second gradient magnetic fields, applying an rf signal to refocus the spins of nuclei in a region defined by the intersection of said strip and a slice orthogonal to the gradient direction of said third gradient magnetic field so that the resulting free induction echo signal arises from the said region alone.

2. The method as claimed in claim 1 in which step 1) comprises the following sub-steps:
    a) applying an rf selective 90° pulse in the presence of the first gradient magnetic field so as to flip the magnetisation in the said slice into a plane perpendicular to the direction of the said static magnetic field;
    b) applying a non-selective rf 180° pulse in the absence of a gradient magnetic field and separately applying a gradient magnetic field to refocus the magnetisation in the said slice;
    c) applying an rf non-selective 90° pulse in the absence of a gradient magnetic field so as to flip the refocused magnetisation of the nuclei in the said slice along a direction parallel to the direction of the said static magnetic field.

3. The method as claimed in claim 1 in which step 1) includes also applying at least one gradient magnetic field pulse in the absence of an rf pulse.

4. The method as claimed in claim 2 in which after the sub-steps a) to c) a sub-step d) is applied comprising a magnetic field gradient pulse having a gradient in said one direction sufficient to destroy the magnetisation outside the said slice.

5. The method as claimed in claim 1 in which step 3) comprises the application of an rf selective 180° pulse in the presence of said third magnetic gradient field followed by a magnetic gradient field pulse having a gradient in the said second direction of duration sufficient to refocus the magnetisation in the region of interest.

6. The method as claimed in any one of the preceding claims in which a phase-encoding magnetic field gradient orthogonal to said one direction is interposed between steps 2) and step 3) and a free-induction signal is acquired in the presence of a magnetic field gradient in said one direction so that the signal contains image information of the said region.

* * * * *